United States Patent
Ho et al.

(10) Patent No.: US 8,837,620 B2
(45) Date of Patent: Sep. 16, 2014

(54) ADAPTIVE MULTI-CHANNEL TRANSMITTER LINEARIZATION SYSTEM USING A SHARED FEEDBACK RECEIVER

(75) Inventors: Tan Ho, Stittsville (CA); Kris Bailey, Ottawa (CA); Peter Zahariev Rashev, Calgary (CA)

(73) Assignee: Optis Cellular Technology, LLC, Plano, TX (US)

( * ) Notice: Subject to any disclaimer, the term of this patent is extended or adjusted under 35 U.S.C. 154(b) by 540 days.

(21) Appl. No.: 13/099,518

(22) Filed: May 3, 2011

(65) Prior Publication Data

US 2012/0281777 A1   Nov. 8, 2012

(51) Int. Cl.
| | | |
|---|---|---|
| H04B 7/02 | (2006.01) | |
| H04L 1/02 | (2006.01) | |
| H04L 27/36 | (2006.01) | |
| H04B 1/04 | (2006.01) | |
| H03F 1/32 | (2006.01) | |
| H03F 3/24 | (2006.01) | |
| H04L 25/03 | (2006.01) | |

(52) U.S. Cl.
CPC ............ *H04L 27/368* (2013.01); *H04B 1/0475* (2013.01); *H04L 25/03343* (2013.01); *H03F 1/3247* (2013.01); *H04B 2001/0441* (2013.01); *H04L 2025/03426* (2013.01); *H03F 3/24* (2013.01)
USPC ........... 375/267; 375/259; 375/285; 375/296; 375/297; 455/114.3; 330/149

(58) Field of Classification Search
USPC .......................... 375/267, 259, 285, 296, 297; 455/114.3; 330/149
See application file for complete search history.

(56) References Cited

U.S. PATENT DOCUMENTS

| | | | | |
|---|---|---|---|---|
| 6,697,436 | B1* | 2/2004 | Wright et al. | 375/296 |
| 6,907,085 | B2* | 6/2005 | Kubo et al. | 375/285 |
| 6,943,627 | B2* | 9/2005 | Leyonhjelm et al. | 330/149 |
| 2004/0021516 | A1* | 2/2004 | Oishi et al. | 330/149 |
| 2004/0029542 | A1* | 2/2004 | Klingberg et al. | 455/131 |
| 2004/0105509 | A1 | 6/2004 | McGowan et al. | |
| 2006/0133535 | A1* | 6/2006 | Jung et al. | 375/296 |
| 2009/0122910 | A1* | 5/2009 | Wen et al. | 375/295 |

(Continued)

FOREIGN PATENT DOCUMENTS

| | | |
|---|---|---|
| EP | 2204903 A1 | 7/2010 |
| WO | WO0003479 A1 | 1/2000 |
| WO | 2010054499 A1 | 5/2010 |

OTHER PUBLICATIONS

PCT Search Report Corresponding to PCT/IB2012/051158.

*Primary Examiner* — Shuwang Liu
*Assistant Examiner* — Sung Ahn
(74) *Attorney, Agent, or Firm* — Vincent J. Allen; James H. Ortega; Carstens & Cahoon, LLP

(57) ABSTRACT

Pre-distortion techniques, devices and systems for a multi-channel transmitter are described. An adaptation time is provided for each of the transmit chains in the multi-channel transmitter. During each adaptation time an output of a transmit chain is coupled to a shared feedback receiver. The shared feedback receiver generates a feedback signal that is used to vary pre-distortion for that transmit chain. A commutation controller varies at least one of: (a) an amount of the adaptation time for a transmit chain and (b) an order in which each of the transmit chains receives its adaptation time.

22 Claims, 9 Drawing Sheets

(56) References Cited

U.S. PATENT DOCUMENTS

| | | | |
|---|---|---|---|
| 2009/0184763 A1* | 7/2009 | Kim | 330/124 R |
| 2010/0087227 A1* | 4/2010 | Francos et al. | 455/562.1 |
| 2010/0093290 A1* | 4/2010 | van Zelm et al. | 455/126 |
| 2010/0166110 A1* | 7/2010 | Neumann et al. | 375/296 |
| 2010/0254299 A1 | 10/2010 | Kenington | |

* cited by examiner

Fig. 6 (CONTINUE)

ADAPTIVE MULTI-CHANNEL TRANSMITTER LINEARIZATION SYSTEM USING A SHARED FEEDBACK RECEIVER

TECHNICAL FIELD

The present invention relates generally to communications systems and in particular to methods, devices and systems associated with multi-channel transmitters.

BACKGROUND

As technology advances, the options for communications have become more varied. For example, in the last 30 years in the telecommunications industry, personal communications have evolved from a home having a single rotary dial telephone, to a home having multiple telephone, cable and/or fiber optic lines that accommodate both voice and data. Additionally cellular phones and Wi-Fi have added a mobile element to communications.

Until relatively recently, the primary use of cellular communications has been for voice communications between people. Even for this usage case, considerable optimization has been performed to carry the comparatively small amount of traffic in an optimal way, for instance the introduction of lower bit-rate codecs. In the last few years, the amount of information that needs to be transmitted has begun to increase dramatically with the increasing ubiquity of smart phones, wireless data services and users communicating with machines, particularly servers on the Internet. The next trend will likely be for mobile devices to be used to support machines communicating with other machines (e.g. "M2M"), for instance for remote monitoring and control and many other applications.

As is well known in cellular telecommunications, radio-communication services are typically provided via an access point, e.g., a base station, which transmits signals to, and receives signals from, mobile devices (also sometimes called user equipment (UEs)). In order to support radiocommunications with a large number of devices which are within its transmission range, a base station will typically transmit and receive signals on a number of different channels and, therefore, will typically include a multi-channel transmitter.

Digital pre-distortion (DPD) is a widely applied technology which is used in the linearization of base stations' multi-channel transmitters. Power efficiency and system performance improvements are achieved by continuously monitoring and improving the output signal in an adaptive, closed loop. The output signal of each transmitter is fed back through a dedicated receiver and down-converted to its digital baseband frequency where a direct comparison with the reference, modem-generated downlink signal can be performed.

For example, as shown in FIG. 1, a traditional DPD system can include multiple transmitter channels or paths 1, . . . , N. Each of the transmitter paths 1, . . . , N includes a transmitter TX1, . . . , TX N and a power amplifier PA1, . . . , PA N. For each of the multiple transmitter paths signals are coupled from the output of a respective PA via couplers 100, 102, 104, etc., and are fed back to a respective feedback receiver 1, . . . , N for radio frequency processing and then on to a digital base band DPD unit 106. However using a separate feedback receiver for each path occupies a lot of space in the base station and consumes significant power.

Another approach is, therefore, to provide a single feedback receiver 200 and switch its processing inputs between the various transmitter channels as shown in FIG. 2 such that the feedback receiver 200 is shared among the various channels and provides feedback for each channel based on switched inputs. More information regarding an example of such a shared feedback receiver can, for example, be found in PCT Application WO 2010/054499.

However, there remains a need for improvement with respect to shared feedback receivers used in digital pre-distortion circuitry associated with multi-channel transmitters.

ABBREVIATIONS/ACRONYMS

DL DownLink
DPD Digital Pre-Distortion
eNB Enhanced NodeB
LMS Least Mean Squares
LTE Long Term Evolution
MAC Medium Access Control
MIMO Multiple-Input Multiple-Output
NCO Numerically Controlled Oscillator
PA Power Amplifier
PDCP Packet Data Convergence Protocol
PDU Packet Data Unit
RLC Radio Link Control
RMS Root Mean Square
TX Transmitter
UE User Equipment
UL UpLink

SUMMARY

Systems and methods according to the exemplary embodiments enable pre-distortion techniques, devices and systems for a multi-channel transmitter. An adaptation time is provided for each of the transmit chains in the multi-channel transmitter. During each adaptation time an output of a transmit chain is coupled to a shared feedback receiver. The shared feedback receiver generates a feedback signal that is used to vary pre-distortion for that transmit chain. A commutation controller varies at least one of: (a) an amount of the adaptation time for a transmit chain and (b) an order in which each of the transmit chains receives its adaptation time.

Among other advantages and benefits, embodiments provide for the sharing of feedback receiver resources, which in turn enables design of smaller size and lower cost radios. Over-design and over-specification of transmitter hardware can be minimized, which results in more economical and efficient systems. Performance of the single shared feedback receiver can be optimized according to embodiments by intelligent scheduling of the sharing and dynamic allocation of time for output observation.

According to one exemplary embodiment a method for adaptively providing pre-distortion in a multi-channel transmitter, wherein each channel is associated with a different transmit chain of elements, includes the steps of providing an adaptation time for each of the transmit chains, during which adaptation time an output of a respective transmit chain is coupled to a shared feedback receiver which generates a feedback signal that is used to vary pre-distortion for the respective transmit chain, and varying at least one of: (a) an amount of the adaptation time for a transmit chain and (b) an order in which each of the transmit chains receives the adaptation time.

According to another embodiment a multi-channel transmitter includes a plurality of different transmit chains, each associated with a different channel, a shared feedback receiver, and a commutation controller configured to provide an adaptation time for each of the transmit chains, during which adaptation time an output of a respective transmit chain is coupled to the shared feedback receiver which generates a feedback signal that is used to vary pre-distortion for the respective transmit chain, wherein at least one of: (a) an amount of the adaptation time for a transmit chain and (b) an order in which each of the transmit chains receives the adaptation time is varied over time.

BRIEF DESCRIPTION OF THE DRAWINGS

The accompanying drawings illustrate exemplary embodiments, wherein.

DETAILED DESCRIPTION

The following detailed description of the exemplary embodiments refers to the accompanying drawings. The same reference numbers in different drawings identify the same or similar elements. Also, the following detailed description does not limit the invention. Instead, the scope of the invention is defined by the appended claims.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification are not necessarily all referring to the same embodiment. Further, the particular features, structures or characteristics may be combined in any suitable manner in one or more embodiments.

Figure 1:
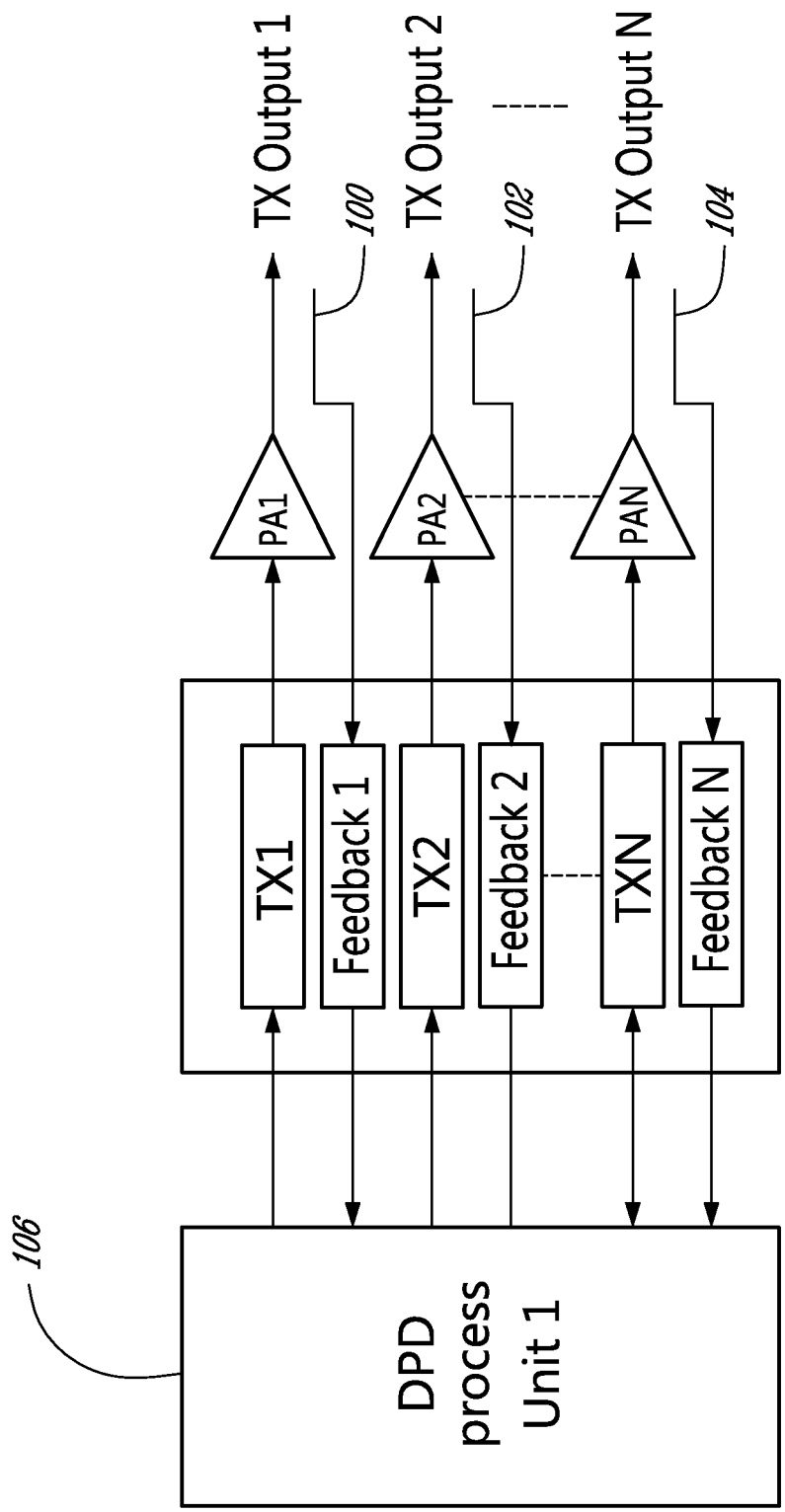
FIGS. 1 and 2 illustrate conventional multi-channel transmitters.

In the context of digital pre-distortion, dedicating a feedback receiver to each transmitter output, e.g., as shown in FIG. 1, enables achieving the best dynamic performance of a linearizer system since any relevant changes in, e.g., the output transmit power, of a particular transmitter or channel can be fed back into the DPD unit virtually instantaneously for adaptation. On the other hand using as many feedback receivers as there are observation points at the transmitter outputs is inefficient in terms of power consumption, size and cost. The latter is a particular problem for units (e.g., base stations) of middle range power capability and more than one antenna port such as, but not limited to, remotely located radios supporting 2×2, 4×4 or larger MIMO ratios.

Figure 2:
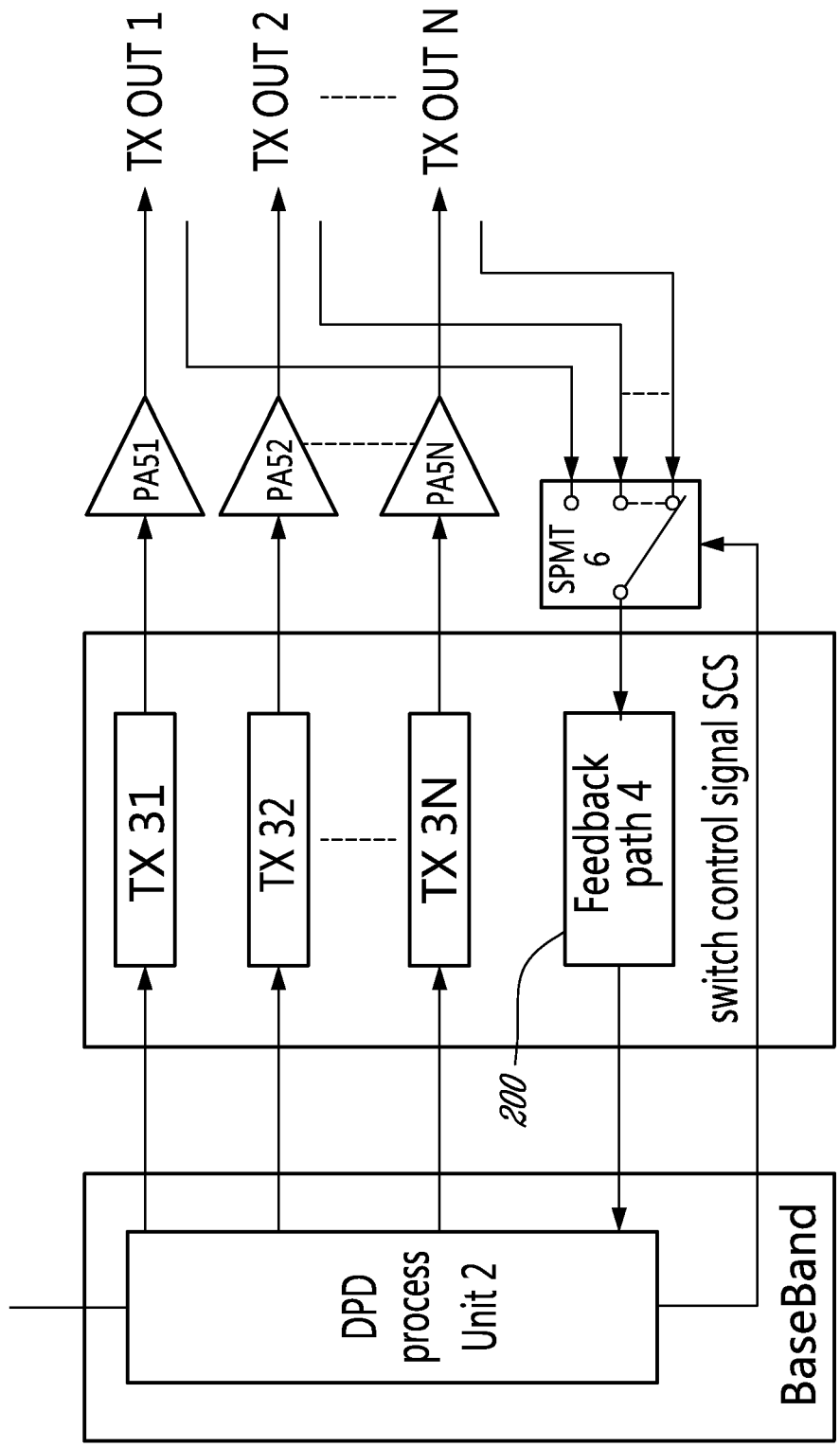

Alternatively, sharing a smaller number of feedback receivers than the number of observation points (transmitter channels), e.g., as shown in FIG. 2, improves the physical size and cost of the overall system. However, the performance of shared feedback receiver linearizers is limited by the speed of change of the power amplifier characteristics as a function of the input signal levels and ambient conditions. That is, during the period of time while the feedback receiver is processing signals from other transmit channels, a given transmit channel's performance will be negatively impacted if certain operating factors vary during that period of time. Thus, the longer that a transmitter is left without adaptation to its dynamically changing properties, the worse the output signal quality is over time. Accordingly, embodiments described herein provide for, among other things, dynamic adaptation of the usage of a shared feedback receiver which addresses this issue.

For example, according to an embodiment a system for transmitter linearization utilizing shared feedback receivers with dynamically controlled commutation can overcome the disadvantages of current linearizers. An embodiment employs a closed loop supervision system which uses information about the signal levels and statistics associated with the input transmit signals, as well as the spectrum of the feedback receiver signal currently connected to one of several transmitter outputs, to adapt usage of the shared feedback receiver.

A scheduling algorithm makes decisions about which transmitter is to be connected to the feedback receiver and for how long. These decisions can, for example, be based on analysis of the rate of change of the average power levels of each of the input signals, as well as the spectral performance of the transmitter outputs. The outputs of the various transmitters are observed and adapted, and their spectral performance is measured, e.g., on a regular basis. In case of a degradation of output performance of a transmitter or a significant change of input signal levels, priority usage of the shared feedback receiver can be given to a particular transmitter. Alternatively, in case of over-performance, a transmitter can be given reduced dwell time with the shared feedback receiver or can be skipped from the sharing sequence.

Figure 3:
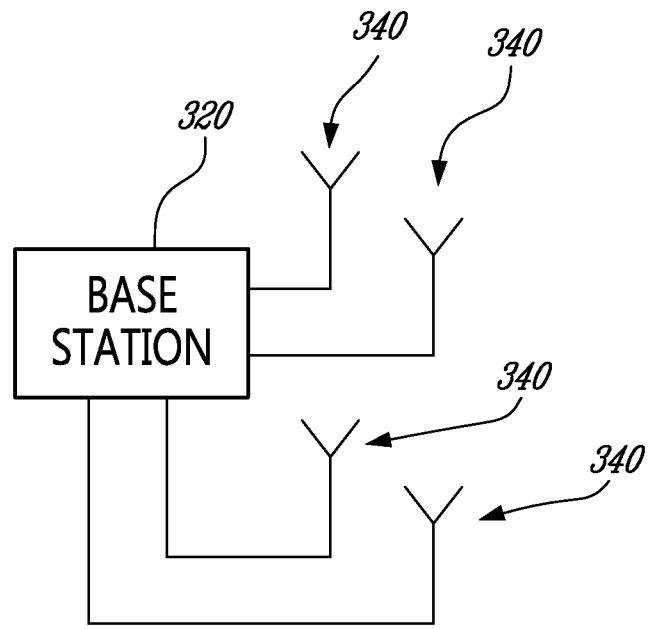
FIG. 3 illustrates an exemplary base station and mobile station in which exemplary embodiments can be implemented.
Figure 3:
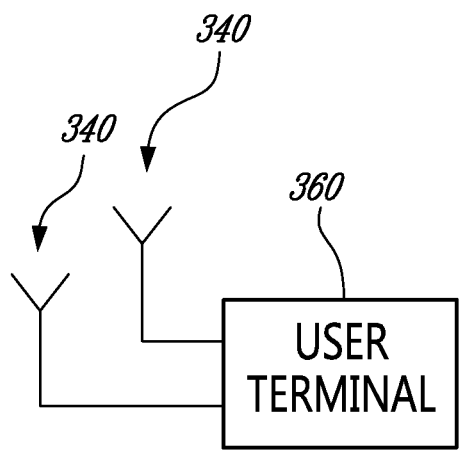
Figure 4:
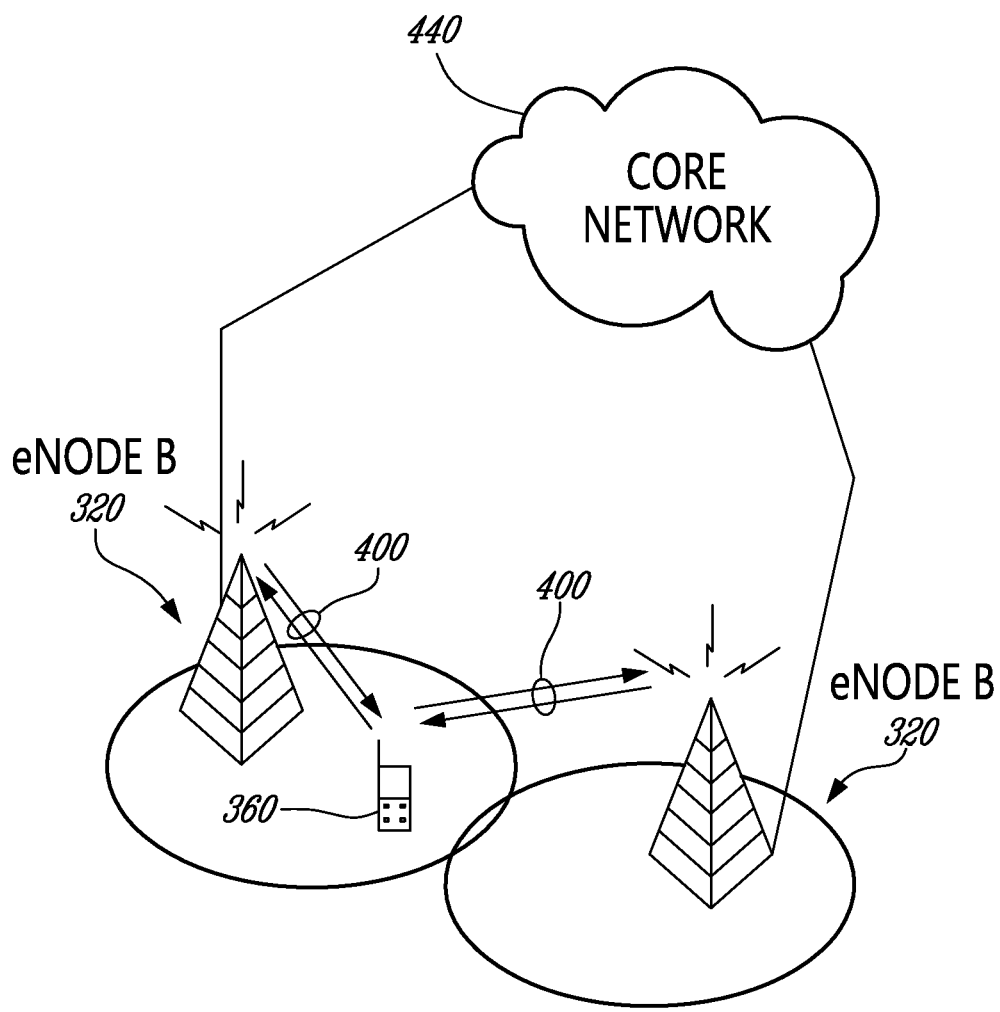
FIG. 4 depicts a radiocommunication system in which exemplary embodiments can be implemented.

To provide some context for a more detailed discussion of such exemplary embodiments related to dynamic adaptation of usage of a shared feedback receiver, consider first an exemplary radiocommunication system as shown from two different perspectives in FIGS. 3 and 4, respectively. To increase the transmission rate of the systems, and to provide additional diversity against fading on the radio channels, modern wireless communication systems include transceivers that use multi-antennas—often referred to as MIMO systems—. The multi-antennas may be distributed to the receiver side, to the transmitter side and/or provided at both sides as shown in FIG. 3. More specifically, FIG. 3 shows a base station 320 having four antennas 340 and a user terminal—also referred to herein as "user equipment" or "UE"—360 having two antennas 340. The number of antennas shown in FIG. 3 is exemplary and is not intended to limit the actual number of antennas used at the base station 320 or at the user terminal 360 in the exemplary embodiments to be discussed below.

Additionally, the term "base station" is used herein as a generic term. As will be appreciated by those skilled in the art, in for example the LTE architecture an evolved NodeB (eNodeB) may correspond to the base station, i.e., a base station is a possible implementation of the eNodeB. However, the term "eNodeB" is also broader in some senses than the conventional base station since the eNodeB refers, in general, to a logical node. The term "base station" is used herein as inclusive of a base station, a NodeB, an eNodeB or other nodes specific for other architectures. An eNodeB in an LTE system handles transmission and reception in one or several cells, as shown for example in FIG. 4.

FIG. 4 shows, among other things, two eNodeBs 320 and one user terminal or UE 360. The user terminal 360 uses dedicated channels 400 to communicate with the eNodeB(s) 320, e.g., by transmitting or receiving RLC PDU segments as described below. The two eNodeBs 320 are connected to a Core Network 440.

Figure 5:
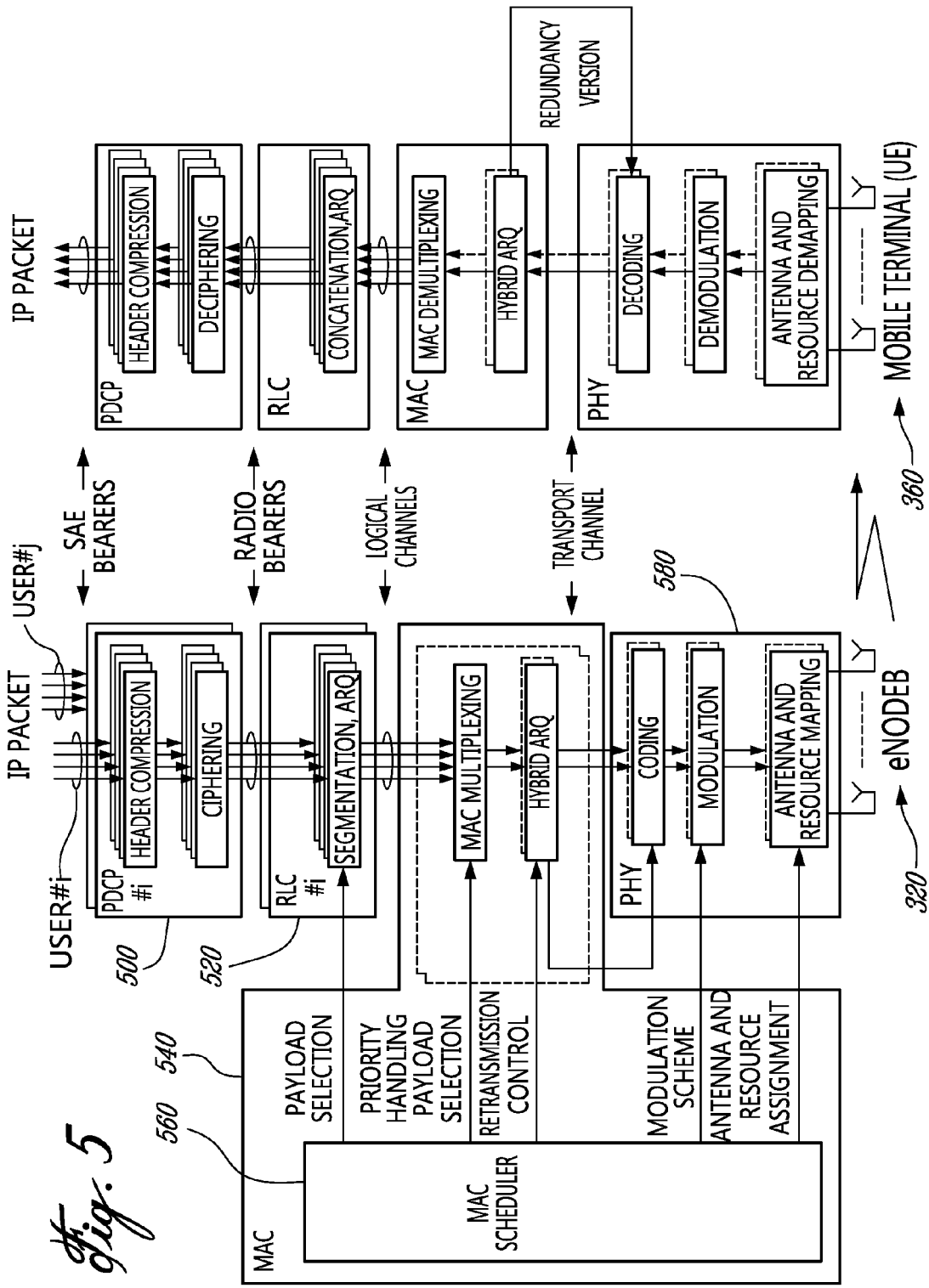
FIG. 5 shows elements of transmit/receive chains in which exemplary embodiments can be implemented.

One exemplary LTE architecture for processing data for transmission by an eNodeB 320 to a UE 360, i.e., in the downlink (DL) is shown in FIG. 5. Therein, data to be transmitted by the eNodeB 320, e.g., IP packets, to a particular user is first processed by a packet data convergence protocol (PDCP) entity 500 in which the IP headers can be compressed and ciphering of the data is performed. The radio link control (RLC) entity 520 handles, among other things, segmentation of—and/or concatenation of—the data received from the PDCP entity 500 into protocol data units (PDUs). Additionally, the RLC entity 520 provides a retransmission protocol, e.g., automatic repeat request (ARQ), which monitors sequence number status reports from its counterpart RLC entity in the UE 36 to selectively retransmit PDUs as requested. The medium access control (MAC) entity 54 is responsible for uplink and downlink scheduling via scheduler 560, as well as hybrid-ARQ processes. A physical (PHY) layer entity 580 takes care of coding, modulation, and multi-antenna mapping, among other things. Each entity 500-580 shown in FIG. 5 provides outputs to, and receives inputs from, their adjacent entities by way of bearers or channels as shown. The reverse of these processes are provided for the UE 360 as shown in FIG. 5 for the received data, and it will be appreciated by those skilled in the art that, although not shown in FIG. 5, the UE 360 also has similar transmit chain elements as the eNB 320 for transmitting on the uplink (UL) toward the eNB 320 and the eNB 320 also has similar receive chain elements as the UE 360 for receiving data from the UE 360 on the UL. It will be appreciated that although an exemplary LTE system is described here for context, that the present invention is not limited to implementation in an LTE system and may be implemented in any radiocommunication system.

Figure 6:
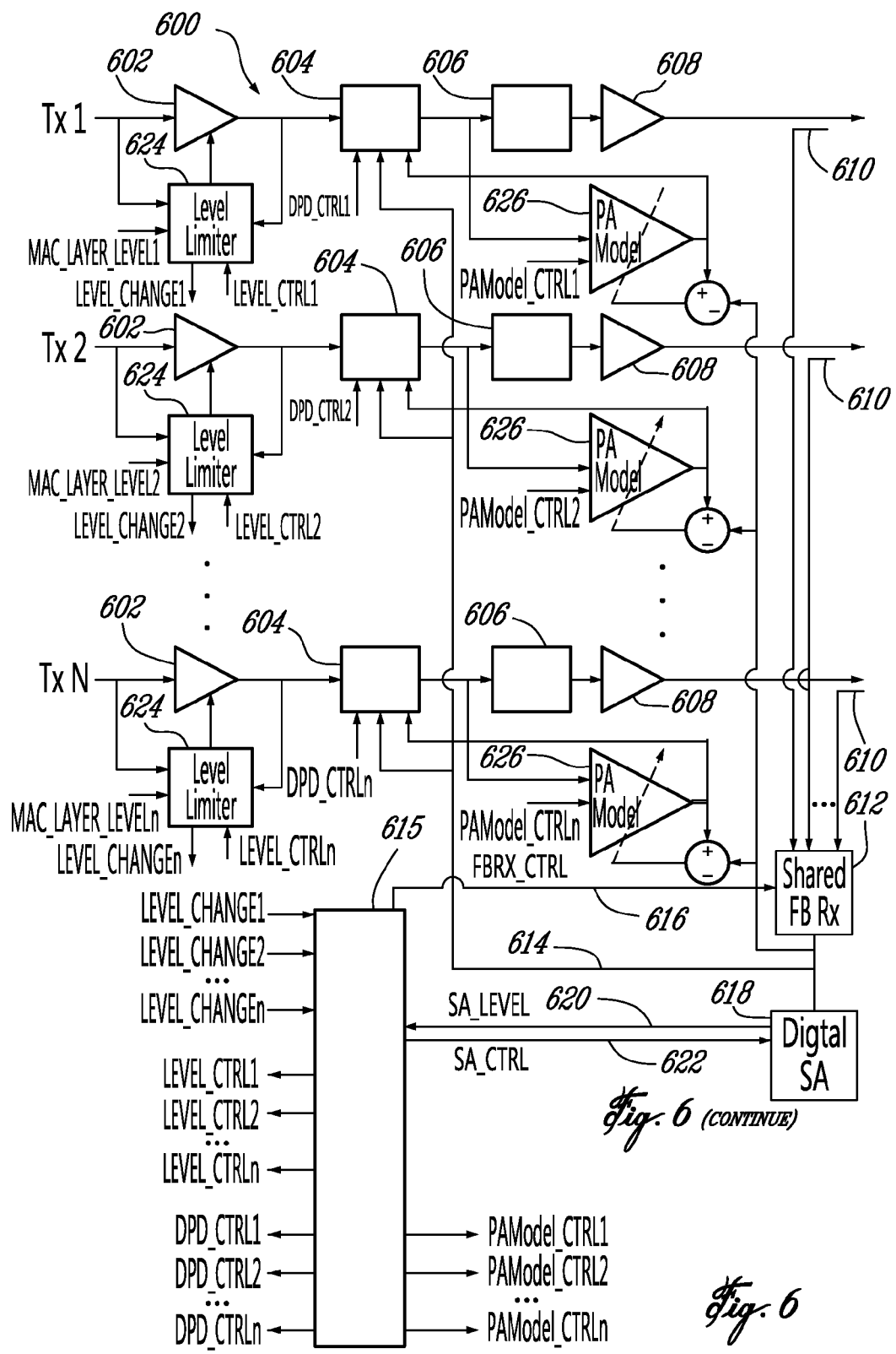
FIG. 6 depicts a multi-channel transmitter according to an exemplary embodiment.

Having described some exemplary devices in which aspects of dynamic adaptation of the usage of a shared feedback receiver according to embodiments can be implemented, the discussion now returns to such embodiments with a discussion of FIG. 6. Therein, a functional block diagram of an adaptive multi-channel transmitter linearization system using a shared feedback receiver is illustrated, which system is generally referenced by numeral 600. FIG. 6 shows N transmitters or channels associated with the transceiver or system 600, however same reference numerals are used in each transmit chain, it being understood that each of the other N−1 transmitters include the same or similar components.

Taking TX1 as exemplary, this transmit chain includes, for example an input TxGain block 602 which receives a modulated, digital data signal being prepared for transmission and which controls the gain of the transmitter TX1 based on various inputs described below. A digital pre-distortion (DPD) module 604 operates, based on various inputs described below, to provide pre-distortion to the signal to be transmitted. The digital-to-analog converter (DAC) and upconverter 606 transforms the digital signal to be transmitted into an analog signal and upconverts the signal to a desired RF frequency for transmission, and the power amplifier (PA) 608 amplifies the analog signal prior to transmission via an antenna (not shown). Note that the term "transmitter", "transmit chain" and "channel" are used interchangeably herein due to the close association between a transmitter, e.g., TX1, its transmit chain of elements and the corresponding channel on which data processed via that transmitter is transmitted.

Each transmitter TX1, . . . , TXN output has a coupler 610 to couple the output RF signal to the shared feedback receiver 612. In this embodiment a single shared feedback receiver 612 serves all of the transmitters in the system 600, e.g., a base station transmitter, however it will be appreciated that other embodiments could provide for more than one shared feedback receiver which operate in accordance with the following discussion. The shared feedback receiver 612 down-converts one of the RF signals which are provided to it by the couplers 610 and provides a down-converted feedback signal 614 to the DPD module 604 in the transmit chain associated with that RF signal. A commutation controller 615 selects which transmitter's TX1, . . . , TXN coupled signal is to be connected to the shared feedback receiver 612 at a given time or time period via the FBRX_CTRL signal 616, e.g., as an input to a switch or multiplexer (not shown) disposed upstream of the shared feedback receiver 612. The commutation controller 615 also generates other control signals, which other control signals are illustrated in FIG. 6 and described in more detail below, for use in adapting the behavior of the transmission system 600 to, among other things, dynamically adapt the shared usage of the shared feedback receiver 612 to changing conditions.

The down-converted signal 614 from the shared feedback receiver 612 is, according to this embodiment, also passed to a digital spectrum analyzer (SA) 618 where the RF output spurious emission level associated with the down-converted feedback signal 614 is measured. This measured level (SA_LEVEL) is passed to the commutation controller 615 for processing via signal 620. The commutation controller 615 controls the operation of the spectrum analyzer 618 via the SA_CTRL signal 622.

Figure 7:
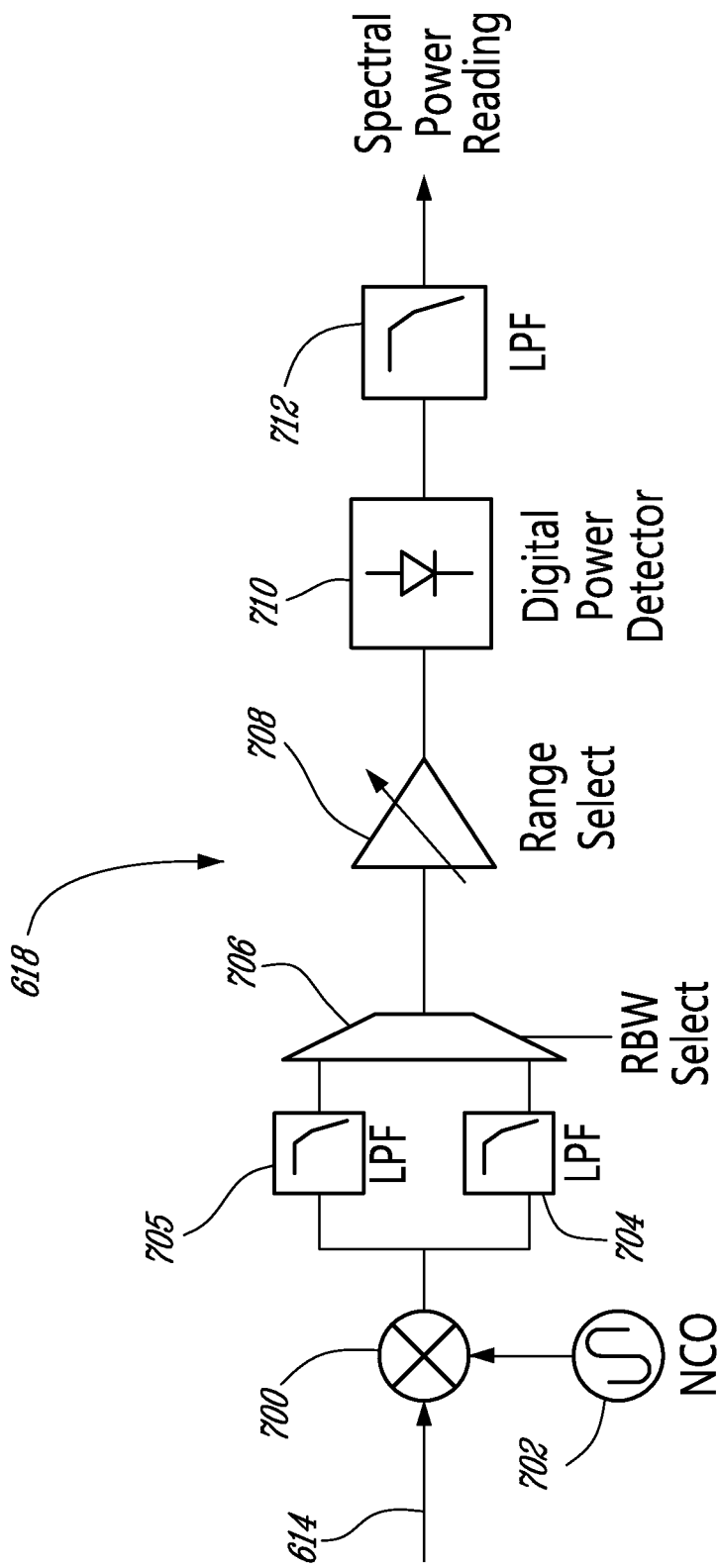
FIG. 7 illustrates a spectrum analyzer which can be used in exemplary embodiments.

FIG. 7 shows a functional block diagram of an exemplary spectrum analyzer 618 for one frequency channel only. The system 600 can however be designed to include, for example, multiple spectrum analyzer channels tuned to different frequencies to provide for time-frequency measurements across the observed bandwidth. The down-converted signal 614 from the shared feedback receiver 612 is fed into a mixer 700 in the spectrum analyzer 618. The numerically controlled oscillator (NCO) block 702 provides the tuning required to select the appropriate frequency offset for the center of a spectral power measurement associated with the signal coupled from the currently selected one of the transmitters TX1, . . . , TXN. Two or more low-pass filters 704, 705, each having different pass-bands, provide for a configurable resolution bandwidth of the spectral power measurement (e.g., 100 kHz and 1 MHz), one of which can be selected by the multiplexer 706 based on an input control signal, e.g., signal 622. The range select function 708 provides a variable gain stage in the spectrum analyzer 618 which is used to adjust the feedback signal 614 to an optimal level for digital power measurement. The digital power detector 710 performs instantaneous power measurement and the low-pass filter 712 provides an averaging function to generate a spectral RMS power reading.

Returning to FIG. 6, according to an embodiment, each TxGain block 602 receives an input from a respective level limiter 624. The level limiter 624 measures the signal level at both the input and output of its respective TxGain block 602 to detect input signal level changes for which DPD re-adaptation is needed. The level limiter 624 in each transmitter compensates for the detected change by either increasing or decreasing the gain of the TxGain block 602 to temporarily maintain the same signal level into DPD 604. Since the shared feedback receiver 612 is shared with other transmitters, this level compensation temporarily avoids the need for DPD adaptation until the commutation controller 615 can schedule the shared feedback receiver 612 for the transmitter where a change is detected and thus, allowing the DPD 604 to adapt.

Thus, once a level limiter 624 detects a change in the input signal level having a magnitude which exceeds a threshold, information about a signal level change is sent from the level limiter 624 to the commutation controller 615 via the LEVEL_CHANGEx signal. This action results in an identifier associated with this transmitter TX1, TX2 or TXN being, for example, placed into a priority queue to be serviced by the commutation controller 615 as described in more detail below. When the commutation controller 615 allocates the shared feedback receiver resource 612 to this transmitter, the commutation controller 615 sends a LEVEL_CTRLx signal to the corresponding level limiter 624 to tell the level limiter to remove its temporary level compensation so that the DPD 604 adapts to the changed or changing signal level for that transmitter.

In addition, there is illustrated in FIG. 6 an optional MAC_LAYER_LEVELx input signal to the level limiter block 624 from the medium access control (MAC) layer, or any other function(s) from the baseband modem which have prior knowledge of a change in the signal level, which MAC_LAYER_LEVELx signal provides early information about a change in signal level. For a system which has access to the MAC layer to obtain early information via the signal MAC_LAYER_LEVELx, about the signal level change, the level limiter 624 can make use of this information to initialize the start of a compensation process without transient latency. This option requires knowledge of the boundary of the symbol/frame of the data synchronized to the MAC_LAYER_LEVELx control bus. Having such MAC layer information helps avoid power level glitches from passing through in cases of rapid power variations which otherwise are compensated by a more complicated design of the AGC algorithm in the level limiter 624. For example, if the system 600 is employed in a so-called 4G or LTE system, the MAC_LAYER_LEVELx input signal could be provided on a per frame basis, a per symbol basis or over any pre-defined period of time.

According to one embodiment, when the commutation controller 615 is ready to service a particular transmitter by providing its coupled feedback signal to the shared feedback receiver 612, the commutation controller 615 can instruct the level limiter 624 to completely remove its previously imposed gain compensation. According to another embodiment, instead of removing the level compensation all at once, the level limiter 624 can do so gradually in one adaptation period or incrementally during several adaptation periods. In other words, if the signal level change is significantly large and/or requiring a much longer DPD adaptation period than allocated by the commutation controller 615, then the level limiter 624 can perform a partial removal of the amount of level compensation per unit time. Complete or partial level compensation removal can be performed, for example, gradually toward the end of the adaptation period (e.g., following a linear ramp profile) and, if necessary, further level compensation removal can continue in the next allocated DPD adaptation period for that particular transmitter.

Also shown in FIG. 6 is an adaptive PA model 626 which is used, in this embodiment, in each transmit path. The PA model 626 is an adaptive model of the PA 608's nonlinear characteristic as a function of input RMS level and ambient conditions. The characteristic variation due to ambient condition is expected to be slow and gradual in system 600. However, the characteristic variation due to input RMS level changing is expected to be significant relative to the magnitude of the change in input RMS level. Therefore, in a shared feedback receiver system, the DPD 604 should be adapted immediately whenever there is a significant change in input RMS level. Thus, according to this embodiment, the DPD 604 in each transmit path can intermittently use the output from its PA model 626 for adaptation instead of continually relying on the output from the actual PA 608. Since the feedback receiver 612 is a shared resource, having an accurate PA model 626 reduces the need for the DPD 604 to rely solely on the feedback receiver 612 with the actual PA 608 output for adaptation, thus, allowing the feedback receiver 612 to be shared among more transmitters TX1, . . . , TXN.

The PA model 626 in a transmit path can be updated whenever the shared feedback receiver 612 is switched to this particular transmit path. The commutation controller 615 controls when the PA model 626 is to be updated via the PAModel_CTRLx signal. The PA model 626 is optional and can, for example, be omitted in some systems.

Figure 8:
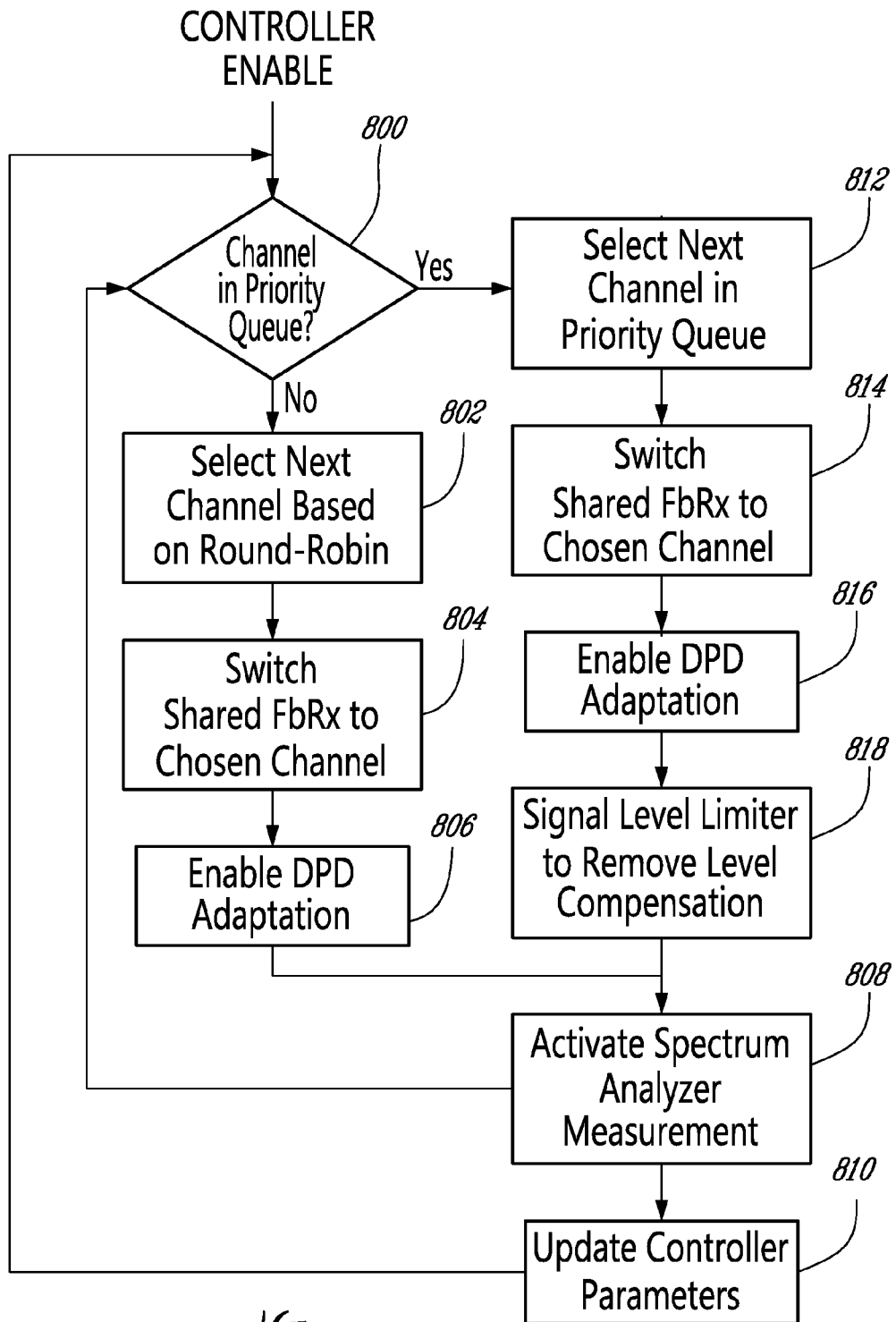
FIG. 8 is a flowchart illustrating an algorithm by which a commutation controller can operate according to an exemplary embodiment.

Having described an exemplary multi-channel transmitter 600 including dynamic adaptation of the usage of a shared feedback receiver 612 according to an exemplary embodiment, a more detailed description of the operation of a commutation controller 615 is now provided with reference to the flow diagram of FIG. 8. As discussed above, the commutation controller 615 receives input from the level limiters 624 and the spectrum analyzer 618. A commutation algorithm processes these inputs and generates appropriate control signals to the PA model 626, level limiters 624, the DPD modules 604, and the shared feedback receiver 612 based, e.g., on the steps illustrated in FIG. 8.

Therein, upon enabling the commutation controller 615, the algorithm starts by checking for channels in the priority queue at step 800. According to an embodiment, the priority queue contains a FIFO list of the channels reported by the various level limiters 624 as having an input signal level change which exceeds the threshold. If the priority queue is empty, the process follows the "No" path from block 800 and the next channel is selected based on a round-robin scheme at step 802. The commutation controller 615 then switches the shared feedback receiver 612 to the chosen channel at step 804. For example, if TX1 had previously received an adaptation period from the commutation controller 615, then the coupled signal from coupler 610 associated with TX2 could be passed to the shared feedback receiver 612 at step 804. Then, the commutation controller 615 enables DPD adaptation for this particular channel at step 806. The spectrum analyzer 618 is then activated, at step 808, by the commutation controller 615 to perform a spectral RMS power reading for the currently selected channel. The commutation controller 615 then updates its control parameters at step 810 (which are discussed in more detail below) and returns back to step 800 to check for channels in the priority queue.

If, at step 800, the priority queue is not empty then the flow proceeds along the "Yes" branch from block 800 to step 812, wherein the next channel chosen for adaptation using the shared feedback receiver 612 is the first channel in the queue. The commutation controller 615 then switches the shared feedback receiver 612 to the chosen channel at step 814. The commutation controller 615 enables the DPD 604 associated with the selected channel at step 816 and then signals the level limiter 624 associated with the selected channel/transmitter to remove the level compensation at step 818, e.g., either completely or gradually as described above. If a significantly large signal level change is associated with placement of this transmitter in the priority queue, the commutation controller 615 could, for example, signal the corresponding level limiter 624 to only partially remove the level compensation during this adaptation period and to perform further removal of level compensation during the next adaptation period which is assigned to this channel/transmitter. This effectively controls the ramp of the input signal level to ensure all transmitters in the system 600 are adequately served by the shared feedback receiver 612. If the full level compensation is removed for a particular transmitter, then that transmitter/channel is removed from the priority queue. If only partial level compensation is removed, the channel is moved to the bottom of the priority queue according to this embodiment.

Continuing on in FIG. 8, after step 818, the commutation controller 615 then activates the spectrum analyzer 618 at step 808 to measure the spurious emission level and updates its control parameters at step 810. In both cases described above, i.e., switching the feedback receiver 612 to evaluate a coupled signal from a channel/transmitter in the priority queue or the next channel/transmitter based on some arbitration scheme, e.g., round robin, the results of the spectrum analyzer measurement are used to adaptively update the system parameters. Since embodiments are adaptive in order to potentially avoid the need for factory calibration of system parameters, the results from the spectrum analyzer measurement are used to adaptively update the following parameters (which are not intended to be exhaustive):

1. Time period for DPD adaptation of a transmitter TX1, . . . , TXN in the case when the signal level change does not exceed the threshold as indicated by the level limiter.
2. Time period for DPD adaptation of a transmitter TX1, . . . , TXN in the case when the signal level change exceeds the threshold as indicated by the level limiter. The adaptation time can be proportional to the magnitude of the signal level change (increase or decrease).
3. The amount of level compensation to be removed by the level limiter 624 during each DPD adaptation period.
4. The threshold used by the level limiter 624 to detect whether the magnitude of the signal level change requires immediate DPD adaptation.

Updates of the system parameters at step 810 can be performed adaptively using, for example, a common least mean squares (LMS) algorithm (in small iterations proportional to an error function value leading to the overall minimization of such error function), however such updates are not limited to this particular type of algorithm. These adaptive updates of the system parameters are useful to optimize the system performance with respect to the sharing of the feedback receiver 612. The first exemplary parameter which can be updated at step 810 is the DPD adaptation time of a transmitter for an input signal level change which does not exceed the level limiter threshold. During each of the adaptation periods, the spectrum analyzer 618 measures the spurious emission level. If the margin is adequate, the update algorithm reduces the DPD adaptation time for subsequent operations on transmitters where the input signal level change does not exceed the threshold. If the margin is not adequate, the update algorithm increases the adaptation time for subsequent operations.

The second exemplary parameter which can be updated at step 810 is the DPD adaptation time of a transmitter with an input signal level change which does exceed the level limiter threshold. Corresponding to the magnitude of the input signal level change, the adaptive algorithm allocates a specific DPD adaptation time. Based on the spectrum analyzer's detected spurious emission margin for this channel, the update algorithm increases or decreases the adaptation time corresponding to the magnitude of signal level change accordingly.

The third exemplary parameter which can be updated at step 810 is the amount of level compensation to be removed by the level limiter 624 during each DPD adaptation period. A larger input signal level change (i.e., particularly an increase) will result in more DPD adaptation time being provided to that transmitter. If an input level change for a given transmitter is too large, i.e., requiring significant DPD adaptation time which is more than what can be fairly allocated without negatively impacting the adaptation of the other transmitters, the allowable input signal level change can be regulated to allow only partial increase or decrease associated with removing the level limiter 624's influence on the TXGain block 602 during a particular DPD adaptation period. According to an embodiment, it is however advantageous for the level limiter 624 to remove as much level compensation as possible during each DPD adaptation period to avoid needing multiple high priority DPD adaptation periods for a particular transmitter. The adaptive update algorithm monitors the spectrum analyzer spurious emission results and either increases or decreases the allowable amount of input signal level change accordingly.

The fourth exemplary parameter which can be updated at step 810 is the threshold used by the level limiter 624 to detect whether the magnitude of the input signal level change requires substantially immediate DPD adaptation as handled by the priority queue. The adaptive update of this parameter can be performed by monitoring the spectrum analyzer measurement. For example, if the threshold is set too high and the signal level change is allowed through by the level limiter 624 without registering the channel into the priority queue of the commutation controller 615, then the spectrum analyzer 608 will measure a spurious emission margin which would have decreased. This is an indication that the threshold should have been set lower to register this channel into the priority queue for high priority DPD adaptation. As a result, the threshold will be lowered accordingly during the update process 810. Increasing of the threshold is done similarly by monitoring the spectrum analyzer measurement. If the channel is registered in the priority queue when it is not necessary (i.e. no significant change in spurious emission margin), the threshold will be increased accordingly.

The preceding examples describe an approach for adaptively updating each of the four exemplary system parameters. However it will be appreciated by those skilled in the art that this set of parameters is not intended to be exhaustive—i.e. there can be other system parameters which can be updated similarly using the available information regarding the input signal level provided by the level limiter and the output spurious emission level provided by the spectrum analyzer. Alternatively, any subset of the four parameters described above could be adaptively updated, and others could remain with fixed values.

The preceding embodiments provide for a number of advantages and benefits. For example, sharing feedback receiver resources enables design of smaller size and lower cost radios. Over-design and over-specification of transmitter hardware can be minimized, which results in more economical and efficient systems. The performance challenges which arise naturally from the usage of a single shared feedback receiver, as opposed to using e.g., one shared feedback receiver per transmit chain, are overcome according to embodiments by smart scheduling of the sharing and dynamic allocation of time for output observation. The input to the control algorithm is composed of direct measurement of the input signals, as well as the actual spectral performance of the transmitter outputs. Embodiments include methodologies which are entirely adaptive, rely on real-time system and signal measurement and have minimal calibration requirements, making systems which employ such methodologies easier to manufacture and sustain. The added benefit of having continuous spectral measurements of the transmit outputs increases the overall base station robustness and reliability to violation of emissions requirements.

Figure 9:
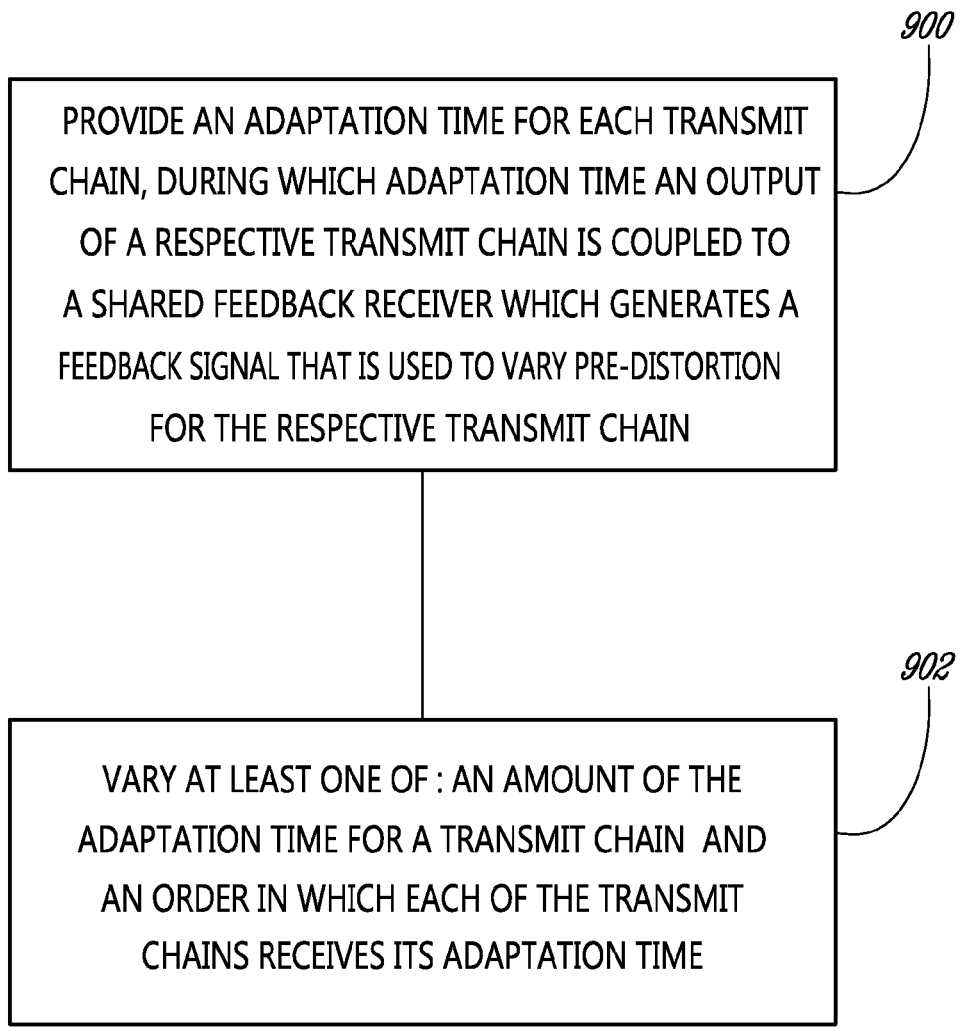
FIG. 9 is a flowchart illustrating a method for adaptively providing pre-distortion in a multi-channel transmitter according to an embodiment.

According to one embodiment, a method for adaptively providing pre-distortion in a multi-channel transmitter, wherein each channel is associated with a different transmit chain of elements, can include the steps illustrated in the flowchart of FIG. 9. Therein, at step 900, an adaptation time can be provided for each of the transmit chains, during which adaptation time an output of a respective transmit chain is coupled to a shared feedback receiver which generates a feedback signal that is used to vary pre-distortion for the respective transmit chain. As indicated by step 902, at least one of: (a) an amount of the adaptation time for a transmit chain and (b) an order in which each of the transmit chains receives the adaptation time, can be varied over time. For example, relative to (a), the method of FIG. 9 could enable TX1 to receive twice as much adaptation time (usage of the shared feedback receiver) as TX2 in FIG. 6 if, for example, signal level changes in the signal being processed by TX1 were substantially more significant than signal level changes in the signal being processed by TX2 for a given time period. As another example, relative to (b), the method of FIG. 9 could change the order or sequence in which adaptation was provided to the transmitters by, for example, initially providing adaptation time to the transmitters in the order of TX 1, TX2, . . . , TXN, and then later providing adaptation time in the order of TX2, TX1, TX2, TX3, TX2, . . . , TXN, e.g., if signal level changes in the signal being processed by transmitter TX2 warranted an increased periodicity of adaptation. This provides, among other things, a dynamic nature to the method and system which balances the pre-distortion needs of the various transmitters.

Systems and methods for processing data according to exemplary embodiments of the present invention can be performed by one or more processors executing sequences of instructions contained in a memory device. Such instructions may be read into the memory device from other computer-readable mediums such as secondary data storage device(s). Execution of the sequences of instructions contained in the memory device causes the processor to operate, for example, as described above. In alternative embodiments, hard-wire circuitry may be used in place of or in combination with software instructions to implement the present invention.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A method for adaptively providing pre-distortion in a multi-channel transmitter, wherein each channel is associated with a different transmit chain of elements, said method comprising:
providing an adaptation time for each of said transmit chains, during which adaptation time an output of a respective transmit chain is coupled to a shared feedback receiver which generates a feedback signal that is used to vary pre-distortion for said respective transmit chain;
coupling a plurality of the outputs of said transmit chains, each of said plurality of outputs associated with a different transmit chain in said multi-channel transmitter, to said shared feedback receiver; and
varying at least one of: (a) an amount of said adaptation time for a transmit chain, and (b) an order in which each of said transmit chains receives said adaptation time, based at least in part, on a priority queue which is populated in response to detected level changes of input signals of said transmit chains prior to pre-distortion, wherein said detected level changes of input signals comprises:
determining, for one of said transmit chains, said input signal level change associated with its input signal;
adjusting a gain of a gain element in said one of said transmit chains in response to said input signal level change; and
adding an identifier associated with said one of said transmit chains to said priority queue if said input signal level change exceeds a threshold;
selecting one of said plurality of outputs of said transmit chains for processing by said shared feedback receiver during said adaptation time; and
providing said feedback signal from said shared feedback receiver to a pre-distortion unit based on said processing of said selected one of said plurality of outputs of said transmit chains.

2. The method of claim 1, further comprising:
removing said gain when said one of said transmit chains is selected for processing by said shared feedback receiver.

3. The method of claim 2, wherein said step of removing said gain is performed instantaneously.

4. The method of claim 2, wherein said step of removing said gain is performed gradually.

5. The method of claim 4, wherein said step of removing said gain is performed over a plurality of adaptation periods associated with said one of said transmit chains.

6. The method of claim 1, wherein said step of selecting further comprises:
selecting as said one of said plurality of outputs of said transmit chains, an output which is associated with a first identifier in said priority queue if said priority queue contains any identifiers; and
otherwise, if said priority queue does not contain any identifiers selecting, as said one of said plurality of outputs of said transmit chains, an output associated with a transmit chain based on an arbitration scheme.

7. The method of claim 6, wherein said arbitration scheme is round-robin.

8. The method of claim 1, further comprising:
passing said feedback signal to a spectrum analyzer;
determining, by said spectrum analyzer, a spurious emission level associated with said feedback signal; and
updating at least one parameter which is used in said varying step based on said spurious emission level.

9. The method of claim 8, wherein said at least one parameter is at least one of: (a) a first adaptation time associated with a transmit chain which is used when an input signal level change associated with said transmit chain does not exceed a threshold, (b) a second adaptation time associated with said transmit chain which is used when said input signal level change associated with said transmit chain exceeds said threshold, (c) an amount of level compensation to be removed by a level limiter during each adaptation time, and (d) said threshold.

10. The method of claim 1, further comprising:
providing a signal associated with a power amplifier model to said pre-distortion unit.

11. The method of claim 1, wherein the step of varying at least one of: (a) an amount of said adaptation time for a transmit chain and (b) an order in which each of said transmit chains receives said adaptation time, is performed based, at least in part, on information received from a baseband modem function.

12. A multi-channel transmitter comprising:
a plurality of different transmit chains, each associated with a different channel;
a shared feedback receiver;
a plurality of couplers each configured to couple an output associated with a different transmit chain to said shared feedback receiver;
a commutation controller configured to select one of a plurality of the outputs of said transmit chains for processing based, at least in part on a priority queue which is populated in response to detected level changes of input signals of said transmit chains prior to pre-distortion and to provide an adaptation time for each of said transmit chains while the output associated therewith is selected, during which adaptation time said output is coupled to said shared feedback receiver which generates a feedback signal that is used to vary pre-distortion for said respective transmit chain; and
a level limiter configured to determine, for one of said transmit chains, said input signal level change associated with its input signal, to adjust a gain of a gain element in said one of said transmit chains in response to said input signal level change, and to transmit a corresponding signal to said commutation controller if said input signal level change exceeds a threshold;
wherein said commutation controller adds an identifier associated with said one of said transmit chains to said priority queue in response to receiving said corresponding signal,
wherein said feedback signal is provided from said shared feedback receiver to a pre-distortion unit based on said processing of said selected one of said plurality of outputs of said transmit chains;
wherein said commutation controller is configured to vary over time at least one of: (a) an amount of said adaptation time for a transmit chain and (b) an order in which each of said transmit chains receives said adaptation time.

13. The multi-channel transmitter of claim 12, wherein said level limiter is further configured to remove said gain when said one of said transmit chains is selected for processing by said shared feedback receiver.

14. The multi-channel transmitter of claim 13, wherein said gain removal is performed instantaneously.

15. The multi-channel transmitter of claim 13, wherein said gain removal is performed gradually.

16. The multi-channel transmitter of claim 15, wherein said gain removal is performed over a plurality of adaptation periods associated with said one of said transmit chains.

17. The multi-channel transmitter of claim 12, wherein said commutation controller is further configured to perform said selecting by selecting as said one of said plurality of outputs of said transmit chains, an output which is associated with a first identifier in said priority queue if said priority queue contains any identifiers; and otherwise, if said priority queue does not contain any identifiers selecting, as said one of said plurality of outputs of said transmit chains, an output associated with a transmit chain based on an arbitration scheme.

18. The multi-channel transmitter of claim 17, wherein said arbitration scheme is round-robin.

19. The multi-channel transmitter of claim 12, further comprising:
a spectrum analyzer configured to receive said feedback signal and to determine a spurious emission level associated with said feedback signal,
wherein said commutation controller updates at least one parameter which is used to vary said at least one of: (a) an amount of said adaptation time for a transmit chain and (b) an order in which each of said transmit chains receives said adaptation time is varied over time.

20. The multi-channel transmitter of claim 19, wherein said at least one parameter is at least one of: (a) a first adaptation time associated with a transmit chain which is used when an input signal level change associated with said transmit chain does not exceed a threshold, (b) a second adaptation time associated with said transmit chain which is used when said input signal level change associated with said transmit chain exceeds said threshold, (c) an amount of level compensation to be removed by a level limiter during each adaptation time, and (d) said threshold.

21. The multi-channel transmitter of claim 12, further comprising: a power amplifier model which provides a signal to said pre-distortion unit.

22. The multi-channel transmitter of claim 12, wherein the commutation controller is further configured to receive a signal from a baseband modem function and varies said at least one of: (a) an amount of said adaptation time for a transmit chain and (b) an order in which each of said transmit chains receives said adaptation time based, at least in part, on information in said signal.

* * * * *

UNITED STATES PATENT AND TRADEMARK OFFICE
CERTIFICATE OF CORRECTION

PATENT NO. : 8,837,620 B2  Page 1 of 1
APPLICATION NO. : 13/099518
DATED : September 16, 2014
INVENTOR(S) : Ho et al.

It is certified that error appears in the above-identified patent and that said Letters Patent is hereby corrected as shown below:

On the title page, Figure, for Tag "618", in Line 1, delete "Digtal" and insert -- Digital --, therefor.

In the Drawings

Fig. 6, Sheet 6 of 9, for Tag "618", in Line 1, delete "Digtal" and insert -- Digital --, therefor.

In the Specification

Column 1, Line 39, delete "equipment" and insert -- equipments --, therefor.

Column 10, Line 27, delete "spectrum analyzer 608" and insert -- spectrum analyzer 618 --, therefor.

Signed and Sealed this
Twelfth Day of April, 2016

Michelle K. Lee
*Director of the United States Patent and Trademark Office*